United States Patent
Samukawa et al.

(10) Patent No.: US 6,177,147 B1
(45) Date of Patent: Jan. 23, 2001

(54) PROCESS AND APPARATUS FOR TREATING A SUBSTRATE

(75) Inventors: Seiji Samukawa; Kenichirou Tsuda, both of Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/280,016

(22) Filed: Mar. 26, 1999

(30) Foreign Application Priority Data

Mar. 27, 1998 (JP) ................................. 10-080948
Oct. 8, 1998 (JP) ................................. 10-286824

(51) Int. Cl.$^7$ ................................. H05H 1/24
(52) U.S. Cl. ............... 427/569; 427/527; 427/528; 427/582; 427/596; 216/65; 216/66; 216/67
(58) Field of Search .................... 427/534, 535, 427/533, 527, 528, 582, 569, 596; 216/67, 66, 77, 79, 65

(56) References Cited

U.S. PATENT DOCUMENTS

| | | |
|---|---|---|
| 3,984,301 | 10/1976 | Matsuzaki et al. |
| 4,374,698 * | 2/1983 | Sanders et al. .................... 156/643 |
| 4,405,406 | 9/1983 | Casey et al. |
| 4,473,436 * | 9/1984 | Beinvogl .......................... 156/643 |
| 4,514,437 * | 4/1985 | Nath .................................. 427/39 |
| 4,922,041 * | 5/1990 | Naumann et al. .................. 570/141 |
| 5,217,911 * | 6/1993 | Denda ................................ 437/39 |

FOREIGN PATENT DOCUMENTS 256 311    2/1988   (EP).

* cited by examiner

Primary Examiner—Shrive Beck
Assistant Examiner—Kristen A. Crockford

(57) ABSTRACT

To produce a desirable amount of desirable radical and/or ion in treating a substrate such as etching the substrate, depositing a thin film on the substrate and the like by using plasma and the like. As a treating gas, a gas such as $CF_mI_n$ and the like containing both a strongly bonded halogen element (F etc.) and weakly bonded halogen element (I etc.) is used. A substrate is treated by active species produced by exciting the treating gas by an excitation means capable of providing an energy which cannot dissociate the strong bond but can dissociate the weak bond. Preferable excitation means is capable of emitting a monochromatic irradiation, having a single value of excitation energy, such as electron beam, light etc., or otherwise capable of providing plasma, having a peak energy value of electrons and sharp electron energy distribution, such as UHF plasma etc.

17 Claims, 8 Drawing Sheets

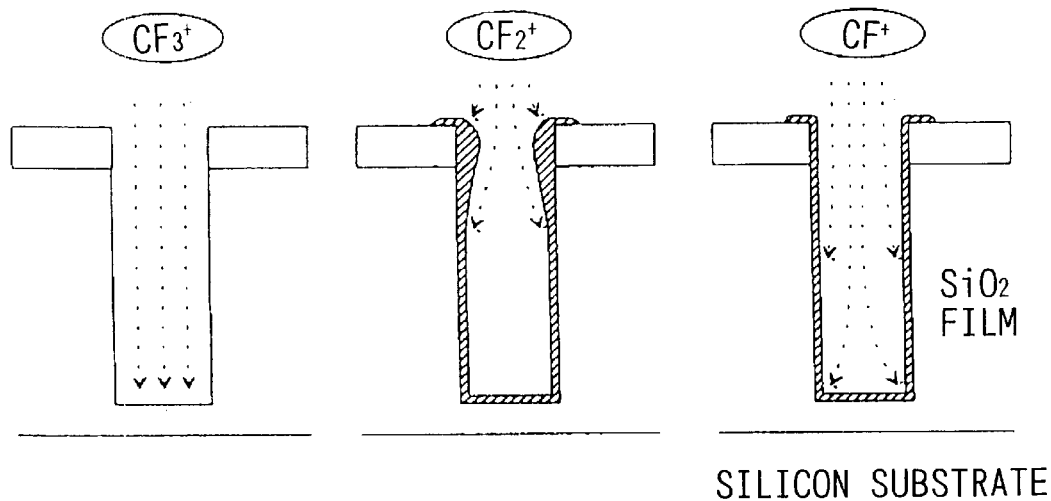
FIG. 1 (a)   FIG. 1 (b)   FIG. 1 (c)
FIG. 2
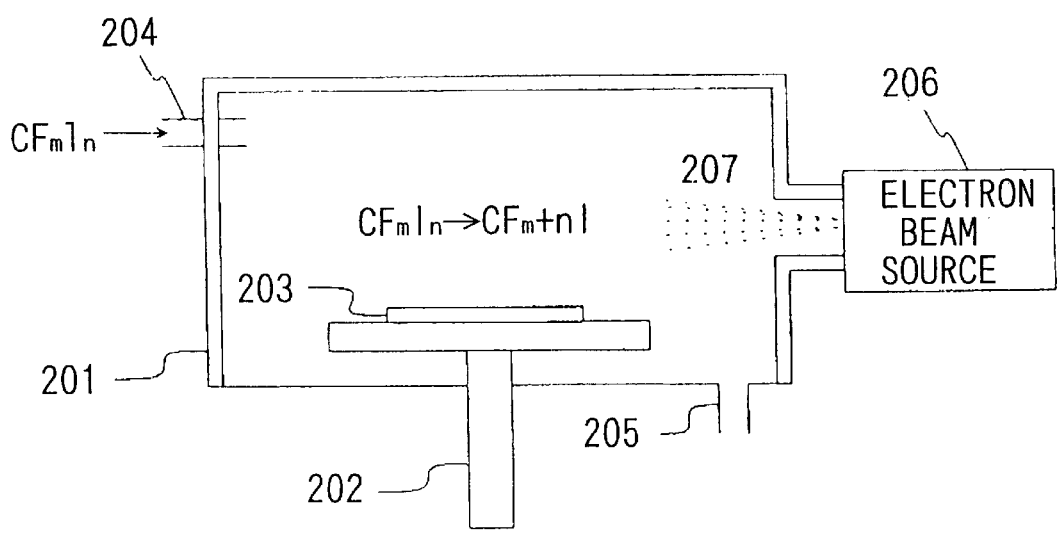

PROCESS AND APPARATUS FOR TREATING A SUBSTRATE

FIELD OF THE INVENTION

The present invention relates to a process and apparatus for treating a substrate by using a halogen-containing gas, more especially to a process and apparatus for etching a substrate or depositing a thin film on a substrate by using a halogen-containing gas.

BACKGROUND ART

The integration of an integrated circuit which is a main part of microelectronics has been increased year by year. With the increase of the integration, process technologies, which can provide a fine pattern on a substrate, such as fine etching technology and the like as well as a thin film deposition technology have been required. Under such requirements, various technologies of applying a halogen-containing gas have been put into practice.

In the etching, which is one of the process technologies, there exist various dry etching technologies for processing a semiconductive substrate or a thin film deposited on the substrate through the steps of using a halogen-containing gas under low pressure or high vacuum and exciting this halogen-containing gas by some means. As for this example, there has been known a process of exciting a halogen gas by exposing to plasma, or by the irradiation of an electron beam, an ion beam or a light. Especially, the etching by exposing to plasma has been widely applied since it is highly practicable. Recently, there have been put into practice high-density plasma etching technologies of applying ECR (Electron Cyclotron Resonance) type of plasma, ICP (Induction-Coupled Plasma), or a plasma method (hereinafter referred as to "UHF plasma") generated in the course of electric discharge caused by applying an electric field of high frequency ranging in VHF to UHF bands, that is, nearly from 100 to 1,000 MHz and the like in addition to parallel-plate type of plasma etching technology. In these etching technologies, using a halogen-containing gas such as fluorocarbon ($CF_4$, $C_4F_8$ and the like) makes it possible to etch a semiconductive material including silicon (Si) and the like, insulating material including silicon oxide ($SiO_2$), silicon nitride (SiN) and the like, and a metallic material including aluminum and the like, or to remove selectively one of these materials by etching. Accordingly, this type of halogen-containing gas is indispensable for forming a fine pattern on the substrate.

In the process technologies other than the etching technology, for example, a thin film deposition technology, a halogen-containing gas also has been widely used as raw materials. As an example of this, a case of depositing a fluorinated amorphous carbon (a-C:F) film by applying a plasma CVD (Chemical Vapor Deposition by using plasma) process is given. As disclosed in Japanese Patent Kokai Publication Nos. JP-A-8-83842 (1996) and JP-A-8-222557 (1996), the a-C:F can be prepared by introducing a fluorocarbon gas such as $CF_4$ and the like solely or together with a hydrocarbon gas such as $CH_4$ and the like into plasma. Many type of plasma can be used in this process. The usable plasma includes parallel-plate type of plasma, ECR type of plasma, ICP, helicon type of plasma, UHF plasma and the like. As for other example, a case of depositing a titanium film by using $TiCl_4$ a case of tungsten by using $WF_6$ and the like are given.

In these processes of treating the substrate, the species which act on the substrate are not parent molecules of the gas themselves but the active species of radicals and/or ions resulting from the dissociation of these molecules by the action of plasma and the like.

SUMMARY OF THE DISCLOSURE

However, The conventional processes for treating a substrate have the following problems.

The most essential problem among them is that it is impossible to control at desire kind and concentration (density) of radicals and/or ions resulting from dissociation of gas molecules by the action of plasma and the like. For example, in case of plasma etching by using the $CF_4$ gas, parent molecules of the gas are excited and dissociated by the energy of plasma electrons to produce radicals and ions. This dissociation process is very complicated. For example, even in the simplest case of $CF_4$, its dissociation process has the steps of $CF_4 \rightarrow CF_3 \rightarrow CF_2 \rightarrow CF \rightarrow C+F$. Further, each content of the radials and ions is determined on complicated mutual balance of various parameters such as pressure of plasma, electron energy, concentrations of all radical and ion species contained in the plasma and the like. Accordingly, it has been hitherto impossible to control the concentrations of the radicals and ions resulting from the dissociation of the halogen-containing gas precisely.

On account that it has been impossible to control the ratio of the radicals and ions resulting from the dissociation of the halogen-containing gas as mentioned above, there has hitherto been the following problems.

Assume an exemplary case of making a contact hole through a substrate of Si by etching a thin film of $SiO_2$ deposited on the substrate in a $CF_4$ gas plasma. In this case, a large etching speed is important first of all, and secondary, a large etching selection ratio (etching rate of the $SiO_2$ film deposited on the Si substrate relative to the Si substrate) is important for ensuring good processability. By the way, there is fluctuation in the etching speed and the thickness of the $SiO_2$ depending on the surface spot of a wafer now. In order to make contact holes through the wafer over its surface without failure under such conditions, it is necessary to overetch the $SiO_2$ film for certain overtime additional to an appropriate time. In order to etch the substrate as little as possible during a given short period of the overtime, a large etching selection ratio is required. When a contact hole is made, e.g., through a diffusion layer of a MOS transistor under the condition of an insufficient etching selection ratio, the diffusion layer will be etched. Accordingly, insufficient etching selection ratio will exert adverse effect on the properties of the produced semiconductive element or deteriorate the operational action of the same.

In the conventional plasma etching process in which neither of the radical nor ion species has been control led, it is difficult to satisfy both of high etching speed and etching selection ratio. For example, in case of maintaining at least 1 $\mu$m/min. of the etching speed, attainable etching selection ratio has been limited to around 50. This value is insufficient to the manufacturing of integrated semiconductive devices. Especially, in the above mentioned MOS transistor, a diffusion layer having shallow junction is inclined to be formed with the improvement of integration. Accordingly, the element destruction due to the overtime of etching has been caused easily more and more.

The reason why it has been hitherto impossible to satisfy high etching speed together with high etching selection ratio is considered as follows. In etching a $SiO_2$ film deposited on a Si substrate termed as "$SiO_2$/Si etching", active species which mainly advance etching are different from those which contribute to the selection of etching. It is generally considered, among the active species resulting from the dissociation of $CF_4$ gas, that $CF_3^+$ ion, which is a low dissociation product mainly advances etching and that $CF_2$ and CF radicals, which are high dissociation products, polymerize to form polymers on the surface to be etched, and thereby contribute to the selection of etching. However, it was difficult to control the ratio of these species in the conventional plasma etching. Accordingly, it has been hitherto impossible to satisfy both of the high etching speed and etching selection rate.

Another problem that the prior art processes for treating a substrate have is that it is difficult to control the fluorine concentration in the a-C:F film deposited by applying plasma CVD. In case that the a-C:F film is used as an interlaminar insulating film, its dielectric constant lowers in proportion to the fluorine content. On the other hand, when the fluorine content is excessively increased, adverse effects such as deterioration of heat resistance, diffusion of fluorine into the surrounding structure of the a-C:F film and the like will be easily brought about. Accordingly, it is important to control the fluorine concentration most appropriately for the use of the a-C:F film in forming the a-C:F film. For controlling the fluorine concentration, it is desirable that the dissociation process to produce radicals and ions in plasma can be at desire controlled. When the plasma contains much of the low dissociation products of radicals and ions such as $CF_3$ and the like, the fluorine content in the film will be increased. In contrast to this, when the plasma contains much of the high dissociation products of radicals and ions such as CF and the like, the fluorine content in the film will be decreased.

However, the ratio of the radical and ion species contained in the plasma has not been controlled in the prior art CVD process similarly to the case of aforementioned plasma etching. As a result, there has not been found any means effective to control the fluorine content in the a-C:F film deposited by using a fluorocarbon gas such as $CF_4$ and the like only.

For controlling radical and ion species to be produced in plasma, there has been tried the following method. One of the prior art methods is that of using plasma having a high electron temperature to raise the ratio of radical and ion species of a relatively high dissociation. In this contrast, another prior art method is that using plasma having a low electron temperature to raise the ratio of radical and ion species of a relatively low dissociation. Further, it has been tried to control the radical and ion species to be produced by changing the kind of a parent gas. Namely, even in the case of using, for example, the same kind of fluorocarbon gas, it has been known that the ratio of $CF_2$ radicals produced by using high molecular weight gas such as $C_4F_8$ and the like is larger than that produced by using low molecular weight gas such as $CF_4$ and the like. By the application of this relationship, the radical content has been tried to be controlled.

However, these prior art methods never provide essential solution onto the above problems. The solution provided by any of these method is no more than increasing the ratio of desired active species by increasing or decreasing the dissociation. Accordingly, there is much desired to provide a control process of producing finally a desirable amount of desirable radical or ion in order to solve the above problems thoroughly.

Accordingly, it is a general object of the present invention to provide a process for treating a substrate such as etching the substrate, depositing a thin film on the substrate or the like by using a halogen-containing gas. The process to be provided should be capable of controlling active species acting on the substrate, i.e., the kind of radical and ion, as well as controlling each concentration of the active species to be produced. This enables optimizing each process for treating the substrate and increasing the freedom of the process.

It is a more specific object of the present invention to make it possible to etch a substrate so as not to cause microloading under the conditions of high speed and high selection ratio, which has been impossible to be simultaneously attained by the application of any of the prior art processes, by producing in any ratio active species which advance etching and active species capable of polymerizing and inhibiting etching by the polymerized polymer, and accordingly, advancing the selection of etching.

It is a further object of the present invention to control quality and properties of a thin film deposited on a substrate such as halogen content in the film, embedment capabilities of the film and the like with high accuracy.

It is still further object of the present invention to improve the property, reliability, yield and the like of a semiconductor device produced by the application of the above process.

The first process of the present invention for treating a substrate includes the steps of: using a gas containing in its molecule a first halogen element and a second halogen element whose elementic number is larger than that of the first halogen element; removing the second halogen element selectively from the gas molecule by an excitation means to produce active species; and irradiating the active species to a substrate. The second process of the present invention for treating a substrate includes the steps of: using plural kinds of gases each containing in its molecule a first halogen element and a second halogen element whose elementic number is larger than that of the first halogen element; removing the second halogen element selectively from each molecule of the gases by an excitation means to produce active species; and irradiating the active species to a substrate. These plural kinds of gases may each have in their molecule a first halogen element and a second halogen element in a ratio different from each other. It is preferable that the first halogen element is fluorine or chlorine, and that the second halogen element is bromine or iodine.

In the present invention, the above excitation means is capable of giving the gas molecule an energy which is larger than the bond dissociation energy of the second halogen element but smaller than the bond dissociation energy of the first halogen element. This excitation means is capable of exciting the gas molecule or the gas molecules by exposing to plasma, the irradiation of charged particles or the irradiation of an electromagnetic wave. Preferable plasma regarding the excitation means is UHF plasma formed by the application of high frequency ranging from 100 MHz to 1,000 MHz.

In the above process, treating may be etching a substrate or depositing a thin film on the substrate.

An apparatus according to the present invention for treating a substrate has a substrate holder, an inlet for charging a treating gas, an outlet for discharging a gas and excitation means for the excitation of the treating gas in a chamber for treating a substrate. The treating gas is one or more of gas containing in its molecule a first halogen element and a second halogen element whose elementic number is larger than that of the first halogen element. The excitation means is capable of giving the gas molecule an excitation energy capable of removing the second halogen element selectively from the gas molecule to produce active species. This excitation energy is larger than the bond dissociation energy of the second halogen element but smaller than the bond dissociation energy of the first halogen element. Preferable excitation means is a UHF plasma excitation means. In this UHF plasma excitation means, UHF plasma is formed by the application of high frequency ranging from 100 MHz to 1,000 MHz.

Function

Taking an case of using the simplest halogenated carbon having one carbon element (hereinafter referred as to "central carbon atom") and four halogen atoms bonded thereto as an example, principal function regarding the present invention will be explained as follows.

Assume a case where all of the four halogen atoms are the same, that is, a halogenated carbon is represented by the general formula: $CX_4$ wherein X is a halogen element, and includes $CF_4$, $CCl_4$ and the like. In this case, the bond dissociation energy between the central carbon atom and halogen atoms differs depending on the kind of halogen elements. There is a tendency that the bond dissociation energy becomes smaller as the atomic number of the halogen element increases. This corresponds to the electronegativity of the halogen elements. Namely, the electronegativity is inversely proportional to the atomic number of the halogen elements and shows the largest value for fluorine which has the smallest atomic number among the halogen elements. Table 1 shows the dissociation energy of the $CX_4$ molecule into $CX_3+X$, i.e., the bond dissociation energy of C—X, when X is F, Cl, Br or I.

TABLE 1

| Kind of bond | C—F | C—Cl | C—Br | C—I |
|---|---|---|---|---|
| Bond dissociation energy (eV) | 4.89 | 3.54 | 3.00 | 2.39 |

The bond dissociation energy shown in table 1 corresponds to variation in the enthalpy required for advancing the reaction: $CX_4 \rightarrow CX_3+X$. This value does not greatly change for a reaction at a further advanced stage of dissociation, represented by, for example: $CX_3 \rightarrow CX_2+X$ and the like. In table 1, the bond dissociation energy of C—F corresponds to a value of 298 K; while other bond dissociation energies are values at 0 K. However, the bond dissociation energy is little dependent on the temperature so that the difference of the bond dissociation energy depending on the change of temperature is negligible. Accordingly, the bond dissociation energy shown in table 1 may be considered as the energy required for dissociating the C—X bond concerning each X of halogen elements.

In case of treating a substrate by using these $CX_4$ type of gas as a treating gas, the parent gas molecule will not dissociate when an excitation energy is smaller than the bond dissociation energy of the C—X bond. Accordingly, in order to produce radicals and/or ions required for the treatment, it is necessary to excite the treating gas molecule by excitation means capable of providing an energy larger than the bond dissociation energy shown in table 1. However, exciting the $CX_4$ type of gas by an energy larger than the bond dissociation energy of the C—X bond causes not only the dissociation of $CX_4 \rightarrow CX_3$ but also more advanced dissociation to produce products of $CX_2$, CX and the like. This is the reason why the control of the active species is difficult in the prior art processes.

Now assume here a case where the four halogen elements consist of different kinds of halogen elements from each other, for example, the case of $CF_2I_2$ gas in which two fluorine atoms and two iodine atoms are bonded to the central carbon atom. In this case, the bond dissociation energy between the central carbon atom and two fluorine atoms is, of course, different from that between the central carbon atom and two iodine atoms. The bond dissociation energy of the C—F bond is large, but that of the C—I bond is small. In the present invention, a desirable form of radicals or ions is produced through the steps of selectively dissociating a weak bond and leaving a strong bond as it is by taking advantage of this difference of the bond dissociation energies. This can be attained by exciting the treating gas by an excitation means capable of providing an amount of energy which is larger than the bond dissociation energy (2.39 eV) of the weak C—I bond, but smaller than the bond dissociation energy (4.89eV) of the strong C—F bond. Through this step, $CF_2$ radical can be produced easily from the above $CF_2I_2$ gas.

To generalize the above discussion, when a treating gas represented by $CX_mY_n$ in which X and Y are halogen elements different from each other, and m and n are positive integers having the relationship of m+n=4, the bond dissociation energy of the C—X bond is represented by $E_x$, and the bond dissociation energy of the C—Y bond is represented by $E_Y$ ($E_X>E_Y$), radical represented by $CX_m$, that is a dissociation product of $CX_mY_n$ from which halogen atoms Y are selectively removed can be obtained by exciting the treating gas by an excitation means capable of providing an energy E in the relationship of $E_Y>E>E_Y$.

In order to ideally obtain a $CX_m$ species without producing any other species, it is desirable that the excitation means is capable of providing a single value of energy of monochromatic irradiation. Such an excitation means is considered to include excitation means capable of irradiating an electromagnetic wave (visible light to ultraviolet light), charged particles such as electron beam, ion beam and etc. or other irradiation. When excitation of the treated gas is performed by using these excitation means so as to satisfy the above energy relationship, a desirable radical which is perfectly selected can be produced.

The following is the explanation of a surface treatment process with an active species produced by excitation of a treating gas molecule according to a process of the present invention in which plasma is used as a excitation means.

On the other hand, electrons originated from plasma have not single value of energy like that of the above monochromatic irradiation, but have a so called Maxwell distribution having a peak energy with a width of energy distribution therearound. As a result, plasma has high energy electrons. Accordingly, the case of using plasma for exciting the treating gas is different from the case of irradiating an electromagnetic wave or charged particles in that perfect selection cannot be attained. However, when plasma has an electron energy distribution as sharp as possible whose peak is positioned in the middle between two bond dissociation energies of the C—Y and C—X bonds or on the energy side lower than the middle, with a small distribution on the high energy side, a desired radical with sufficient selection enough to be put into practice can be obtained. For example, UHF plasma h has a sharp energy distribution, and its peak energy can be changed depending on discharge frequency. Accordingly, it is preferable to apply the UHF plasma in the process of the present invention. In case of using a plasma excitation means as an excitation means, perfect selection of active species cannot be attained as mentioned above. However, the plasma excitation means has the advantage that a radical having a very high density can be obtained on account that interaction between electrons in plasma and the treating gas, that is, excitation efficiency is very large.

In addition, high energy electrons existing in plasma are useful for ionization of radicals selectively produced. Generally, an energy required for ionization of a radical (ionization potential) is larger than that required for dissociating a parent molecule to produce the radical. For example, ionization potentials each required for ionizing $CF_3$, $CF_2$ and CF radicals to produce monovalent positive ions are 10.3 eV, 16.4 eV and 21.4 eV, respectively. Accordingly, no ion can be produced when a monochromatic excitation energy source such as the aforementioned electron beam and the like is used, although the radical can be produced completely selectively. In this contrast, when plasma is used as an excitation source, ions proportional to produced radicals can be produced because high energy electrons are present in plasma without fail.

In the specification of the present application, the expression the term "producing an ion or radical selectively" includes a case of attaining perfect selection of active species like the case of producing active species by the irradiation of an electromagnetic wave or charged particles, and also a case of attaining selection of active species to an extent of actually causing no problem like the case with producing active species by using a UHF excitation means.

In case of using a usual plasma excitation means, in which the plasma has a wide electron energy distribution, as an excitation means for exciting $CX_mY_n$, certain effect can be expected. Usual plasma contains high energy electrons in a relatively large ratio. These electrons are also capable of dissociating the strong bond (C—X bond) of the treating gas molecule. However, the C—Y bond is dissociated more easily than the C—X bond in the treating gas molecule. Accordingly, even when high energy electrons collide with the treating gas molecules, the C—Y bond will be dissociated in high probability.

The function regarding the present invention has been explained in the above, taking the case of using the gas whose molecule is composed of one central carbon atom a and four halogen atoms bonded thereto and represented by $CX_mY_n$ in which m+n=4 and which corresponds to methane if X and Y are all hydrogen elements. It is needless to say that another treating gas may be used in the process of the present invention. For example, a treating gas to be used may be alkane $C_lX_mY_n$ gas of in which X and Y are different from each other and each represents a halogen element, 1, m, and n are positive integers, and m+n=2l+2. The treating gas may contain a double bond of C=C.

Taking the case of exciting a treating gas of $C_2F_5I$ ($CF_3$—$CF_2$—I) according to the process of the present invention as an example, the C—I bond, which is the weakest in the parent molecule, is dissociated to produce $C_2F_5$ radical at first. When a provided excitation energy is larger than the bond dissociation energy (4.0 eV) of C—C bond in the molecule, dissociation will be further advanced to produce $CF_3$ and $CF_2$ radicals in the ratio of 1:1.

Also the treating gas may be a gas of a molecule having a carbon double bond(s). In this case, the carbon double bond can be dissociated without dissociating the C—F or C—Cl bond since energy of the carbon double bond is relatively small (dissociation energy of C=C bond in $C_2F_4$ is 2.39 eV)

Further, a part of X and/or Y may be substituted by other element such as hydrogen element, oxygen element or the like. In short, a gas having in its molecule plural kinds of chemical bonds whose bond dissociation energies are different from each other can be used in the process of the present invention.

A single kind of gas was used as the treating gas in the above explanation. However, a substrate can be treated by using plural kinds of treating gases. In this case, plural kinds of active species can be produced in any ratio. The produced species will be greatly effective for treating a substrate such as etching the substrate, depositing a thin film on the substrate or the like. In case of exciting a gas mixture of, for example, $CF_3I$ and $CF_2I_2$ in an appropriate ratio, $CF_3$ and $CF_2$ radicals (or ions) will be obtained approximately in the same ratio as that of the mixture.

The above gas mixture may be further contained a usual treating gas, which has been used in the conventional process, such as $CF_4$, $O_2$, $H_2$ and the like.

The radical and/or ion produced through the above manners of the present invention are applied to various treatments of a substrate such as etching, CVD and the like. In any case of treating a substrate, it is important to provide the radical and/or ion in such amount or ratio that is optimum for the aimed treatment of a substrate. The radical and/or ion may be produced just above the substrate like a usual plasma etching or plasma CVD, or at a place apart from to the substrate followed by transporting (by a remote plasma method or the like).

In etching which is performed in the course of a semiconductor production process, it is taken the advantage of fluorine or chlorine which is highly reactive to materials to be usually treated such as silicon, silicon oxide, metal and the like. On the other hand, bromine or iodine shows little effect of etching. Accordingly, in etching a substrate according to the present invention, it is effective to use fluorine or chlorine as the halogen element X. In this case, bromine or iodine, which has an electronegativity less than that of fluorine or chlorine, is used as the halogen element Y. Due to its poor reactivity bromine or iodine will be discharged after etching almost without substantial contribution to the etching.

As explained above, desired ion or radical in desired amounts can be produced in the process of the present invention. Accordingly, the purpose of the present invention can be attained.

The preferred embodiments of the present invention will be explained in reference to the accompanying drawings.

BRIEF DESCRIPTION OF DRAWINGS

FIG. 1 is a schematic view for explaining the action of active species in the course of etching a thin film of $SiO_2$ deposited on a Si substrate.

FIG. 2 is a rough view of an electron-beam-excitation etching apparatus used in Example 1 of the present invention.

PREFERRED EMBODIMENT

Figure 3:
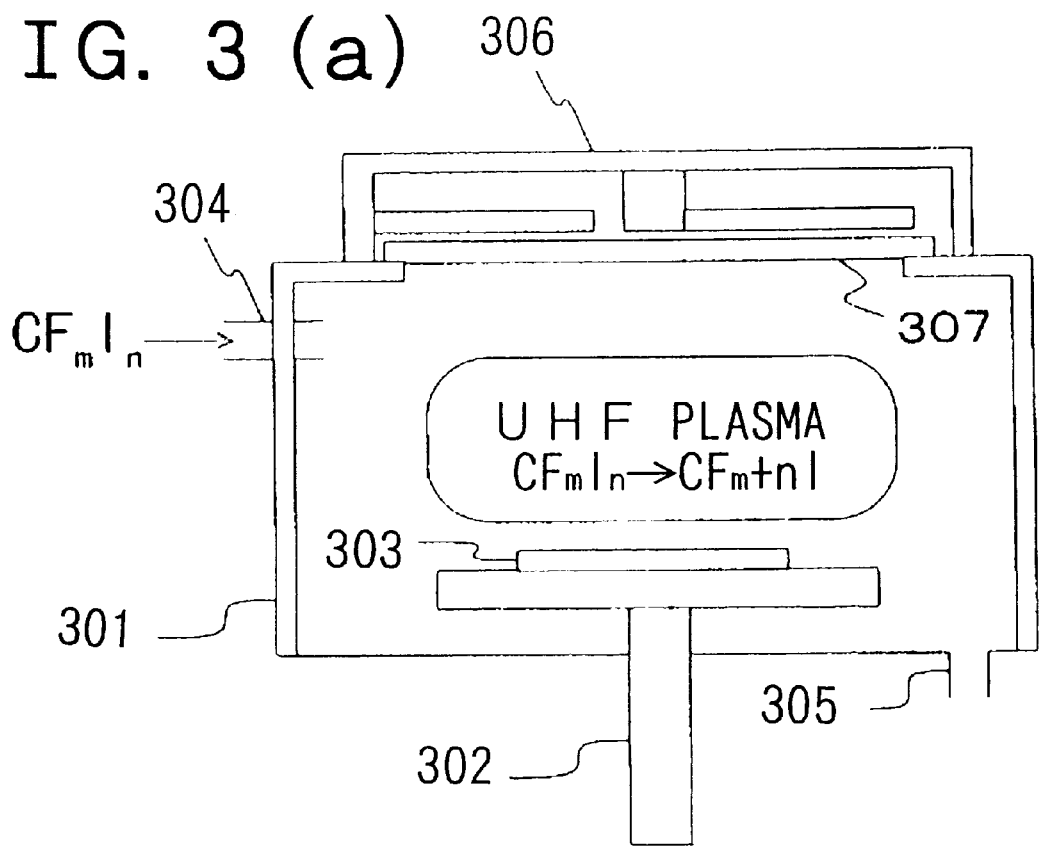
FIG. 3 is a rough view of a UHF plasma etching apparatus used in Examples 2 and 3 of the present invention.
Figure 3:
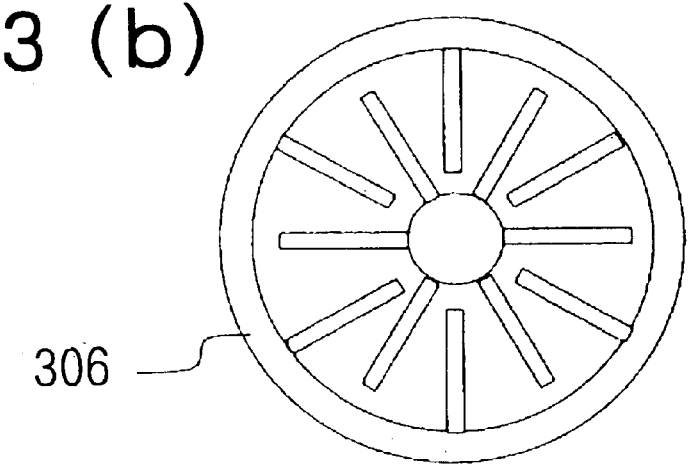

In the first embodiment of the present invention, etching process to which the present invention is applied will be explained. An object to be etched is a silicon oxide film deposited on a silicon substrate, and an opening corresponding to a contact hole to be made in the course of a semiconductor production process will be made according to a process of the present invention. A main object of this process is to ensure a selection ratio of etching $SiO_2$ while maintaining a sufficient etching speed. In order to attain this object, a gas mixture of $CF_3I$, $CF_2I_2$ and $CFI_3$, that are substituted $CF_4$ whose halogen elements are partially substituted by iodine, was used for a treating gas for carrying out the present invention.

FIG. 1 is a schematic view showing a role of each ion or radical in case of etching $SiO_2/Si$ (a $SiO_2$ film deposited on a Si substrate) by using a $CF_4$ series of gas. Among the ions and radicals resulting from the dissociation of $CF_4$, $CF_3^+$ ion a high weight of plays the role of advancing etching $SiO_2$ on Si (FIG. 1($a$)). On the other hand, $CF_2$ and CF radicals are deposited on the side and bottom walls of the silicon oxide to polymerize and inhibit the etching by the ion. The hatched area in FIGS. 1($b$) and 1($c$) shows schematically the formation of a polymer. Accordingly, it is possible to realize both of sufficient etching speed and high selection ratio of etching by producing ions for advancing the etching and radical capable of polymerizing and protecting the side and bottom walls by the resultant polymer in an appropriate ratio.

It should be noted that a $CF_2$ radical cannot arrive at the bottom of a contact hole when it has a high aspect ratio and is easy to deposit around the entrance of the hole on account that the $CF_2$ radical has a high adsorbability to the $SiO_2$ on the Si in addition to that the $CF_2$ radical is a main precursor of a polymer to be deposited and has a high depositing speed. This phenomenon is called "microloading". When the entrance of the hole is shut by the polymer deposited on the side wall around the entrance, etching will not advance any more. On the other hand, CF has a low adsorbality to the $SiO_2$ on the Si and accordingly, can arrive at and polymerize on the bottom of a contact hole even if the hole had a large aspect ratio.

Taking the above matters of fact into consideration, in order to obtain active species of $CF_3$, $CF_2$ and CF in the ratio of $CF_3:CF_2:CF=5:2:3$ for etching very selectively a $SiO_2$ film deposited on a Si substrate at a sufficient etching speed to make a contact hole of high aspect ratio and inhibiting the macroloading, etching was carried out by using a gas mixture of $CF_3I$, $CF_2I_2$ and $CFI_3$ in the ratio of $CF_3I:CF_2I_2:CFI_3=5:2:3$ as a treating gas, exciting and dissociating the gas by an excitation means and exposing irradiating the resultant active species to a substrate.

EXAMPLE 1

Example 1 of the present invention relates to a case of using an energy-controlled electron beam for an excitation means for producing radicals from the above mixed gas.

FIG. 2 shows a rough view of an etching apparatus used in carrying out this example. The etching apparatus has a substrate holder 202 in a vacuum chamber 201 made of stainless steel and a substrate 203 to be treated held on the substrate holder 202. A treating gas is introduced into the vacuum chamber 201 through an inlet 204 for charging the treating gas. The gas in the vacuum chamber is discharged through an outlet 205 by vacuum discharging with a discharge pump which is not shown in any figure of the accompanying drawings. On the side of the vacuum chamber 201 an electron beam source 206 is installed. An electron beam 207 illustrated by a broken line is irradiated from this electron beam source 206 into the vacuum chamber 201. The treating gas is dissociated by the action of the electron beam 207 to produce radical and/or ion.

As a treating gas, the aforementioned gas mixture of $CF_3I$, $CF_2I_2$ and $CFI_3$ in the ratio of $CF_3I:CF_2I_2:CFI_3=5:2:3$ was used. The inner pressure of the vacuum chamber was kept $10^{-4}$ Torr at the time of introducing the gas. The energy of the electron beam for an excitation means may be in the range between the bond dissociation energy of C—I bond (2.39 eV) and the bond dissociation energy of C—F bond (4.89 eV). The treating gas was excited by irradiating the electron beam of, for example, 3 eV.

By applying the above process, no ion can be produced because the excitation energy is smaller than the ionization potential of a radial, although the radical can be produced by the dissociation of a parent molecule. However, desired radical and/or ion can be produced by applying a process of irradiating an electron beams, which is different from the aforementioned electron beam for producing a radical and which has an energy corresponding to the ionization potential of a desired ion to be produced, apart from irradiating the electron beam for radicalization.

A substrate to be treated was a $SiO_2$-deposited Si wafer. The $SiO_2$ was 10 $\mu$m thick. There was formed on the $SiO_2$ a resist of the pattern having hole-shaped portions irradiated correspondingly to contact hales to be made. The diameters of the contact holes ranged from 0.1 to 1 $\mu$m. This range under the condition of 10 $\mu$m in thickness corresponds to an aspect ratio of 100 to 10.

Under the aforementioned conditions, the substrate was treated. This resulted in about 100 of an etching selection ratio of $SiO_2/Si$ which is much higher than the conventional value. Further, the microloading was not observed even on the spot of a contact hole, having a high aspect ratio, of 0.1 $\mu$m in diameter. Active species produced in the vacuum chamber in the course of etching were determined by emission spectroscopic analysis and mass spectrometric analysis. As a result, the active species were a mixture of $CF_3$, $CF_2$ and CF in the ratio of $CF_3:CF_2:CF=5:2:3$ correspondingly to the treating gas composition.

This result indicates that it is possible to produce desired radicals in a desired ratio by means of an electron beam for an excitation means to improve etching properties according to the present invention. It is needless to say that the similar result will be obtained by means of a visible or ultraviolet light. However, excitation of a treating gas by these means includes a problem that the excitation efficiency of the treating gas is low and improvement in the treating speed is difficult. This problem can be solved by using the following plasma excitation means.

EXAMPLE 2

In this example, a case of etching a substrate by radical and/or ion resulting from exciting a gas mixture of $CF_3I$, $CF_2I_2$ and $CFI_3$ by means of plasma is referred. Used plasma was UHF plasma produced by the application of high frequency of VHF to UHF band (about 100 to 1,000 MHz).

FIG. 3 shows a UHF plasma etching apparatus used in this example. This UHF plasma etching apparatus is equipped with a substrate holder 302 which also works as an electrode at the lower part of a vacuum chamber 301 made of stainless steel and a substrate 303 to be treated held on the substrate holder 302. A treating gas is introduced into the vacuum chamber 301 through an inlet 304 for charging the treating gas. The gas in the vacuum chamber is discharged through an outlet 305 by evacuating with a discharge pump which is not shown. On the vacuum chamber 301 a spoke antenna 306 opposed to the substrate holder 302 (electrode) is installed. This spoke antenna 306 is coupled to a treating room for producing plasma through the intermediary of a quartz window 307. The shape of the spoke antenna 306 is illustrated in FIG. 3(b).

Etching by using the above UHF plasma etching apparatus will be made in accordance with the following steps. At first, the substrate 302 to be etched is put into the vacuum chamber 301 and held on the substrate holder 302. The substrate holder 302 is desirably equipped with a substrate-fixing means such as electrostatic chuck and the like. Then, sufficient evacuation inside the vacuum chamber 301 is made by an evacuating discharge means. Subsequently, a treating gas is introduced into the vacuum chamber 301 to keep its pressure in the range of about 1 to 10 mTorr. While this state is kept, UHF plasma is produced by introducing UHF electric power from the spoke antenna 306 located above the vacuum chamber 301.

Figure 4:
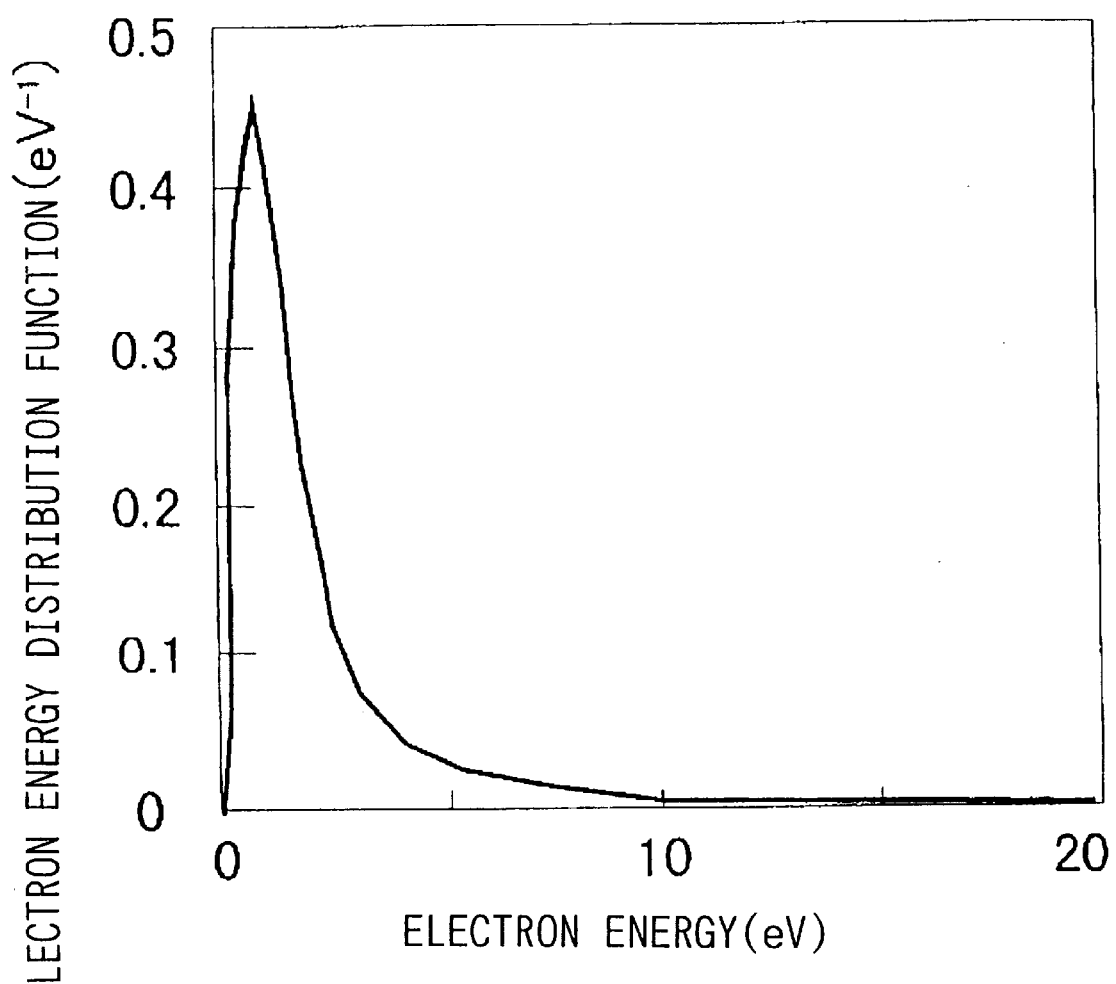
FIG. 4 is a graph showing an electron energy distribution in UHF plasma.
Figure 5:
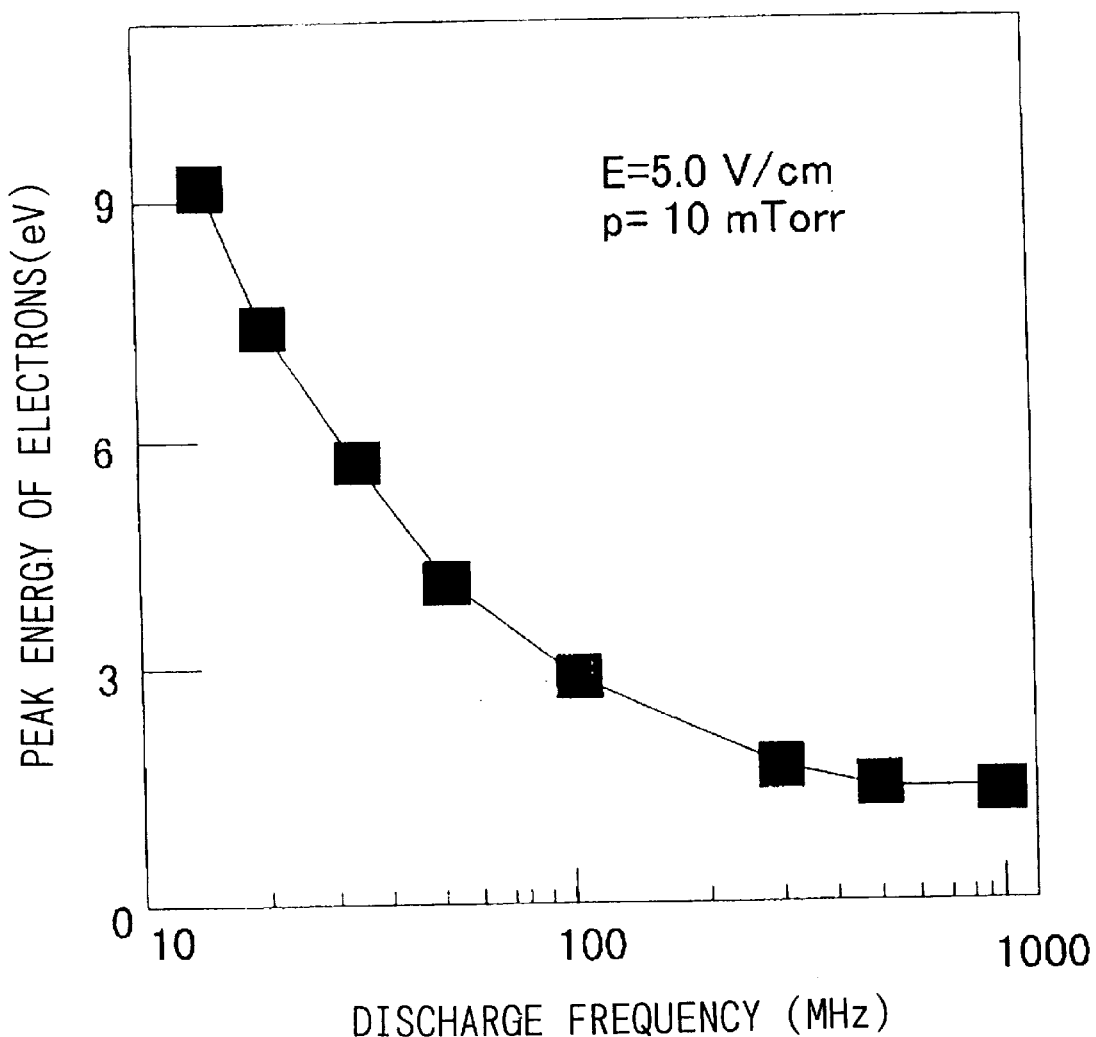
FIGS. 5 is a graph showing the relationship between peak energy of electrons contained in UHF plasma and discharge frequency of the UHF plasma.

The first characteristic feature of the UHF plasma is to be easily obtainable under a low pressure of about several mTorr and to have a high density(concentration) of $10^{11}$/cm$^3$. Other characteristic features of the UHF plasma are as follows. The UHF plasma has very sharp electron energy distribution as compared with other plasma. FIG. 4 is a view showing the electron energy distribution of UHF plasma produced by the application of high frequency of 500 MHz. This UHF plasma has a very sharp electron distribution having a peak of about 1.5 eV at its center. The ratio of high energy electrons contained in this UHF plasma is very low. The peak energy in the electron distribution can be changed depending on the frequency of UHF. FIG. 5 is a view showing the change of the peak electron energy in case of changing a discharge frequency approximately within a range of 10 to 1,000 MHz. This proves that it is possible to control the energy peak of electrons approximately in the range of 1.5 to 9 eV depending on the discharge frequency.

These characteristic features indicate that UHF plasma is very preferable for applying in producing radical(s) and/or ion(s) according to the present invention. It is an essential requirement of the present invention not to dissociate a strong bond in a molecule but to dissociate a weak bond in the same molecule. In order to satisfy this requirement, ability of controlling an excitation energy and sharp electron energy distribution are necessary for the excitation means. For example, in the UHF plasma shown in FIG. 4 obtained by applying a discharge frequency of 500 MHz, electrons are almost distributed in the range of about 0 to 4 eV, and other electrons which have higher energies more than 4 eV show a very small distribution. Among the higher energy electrons present in a small amount, much electrons spend their energy for dissociating a weak bond of the treating gas molecule and for ionizing a parent gas molecules or dissociated radicals. As a result, the ratio of dissociating a strong bond of the treating gas molecule is very little. On these accounts, the condition of dissociating the C—I bond (2.39 eV) or C—Br bond (3.00 eV) without dissociating the C—F bond (4.89 eV) can be realized.

Here, plasma properties will be explained as follows in case of exciting a treating gas applied in this invention which contains two or more kinds of halogen elements as compared with the case of using a conventional treating gas.

Figure 6:
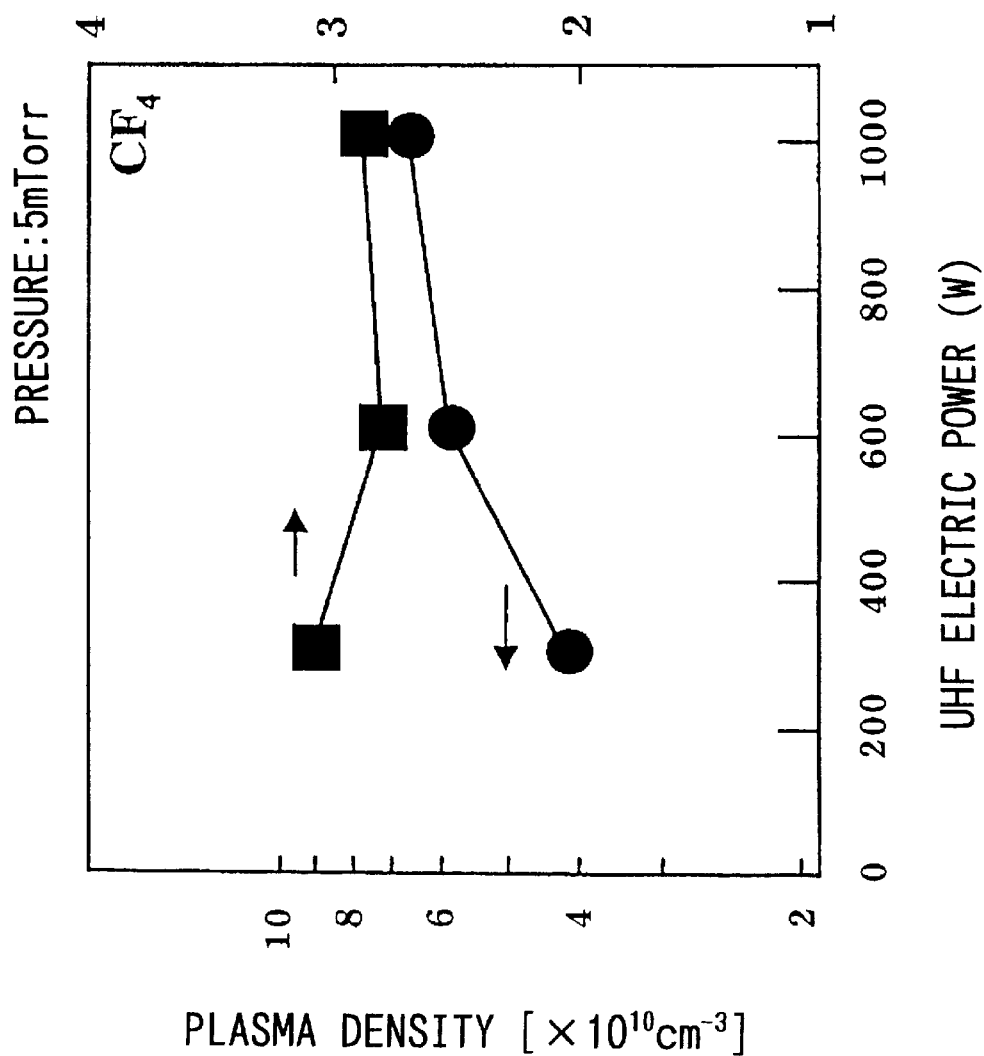
FIG. 6 is a graphic view showing plasma density and electron temperature versus UHF electric power in case of exciting $CF_4$ gas with UHF plasma according to a conventional process.
Figure 7:
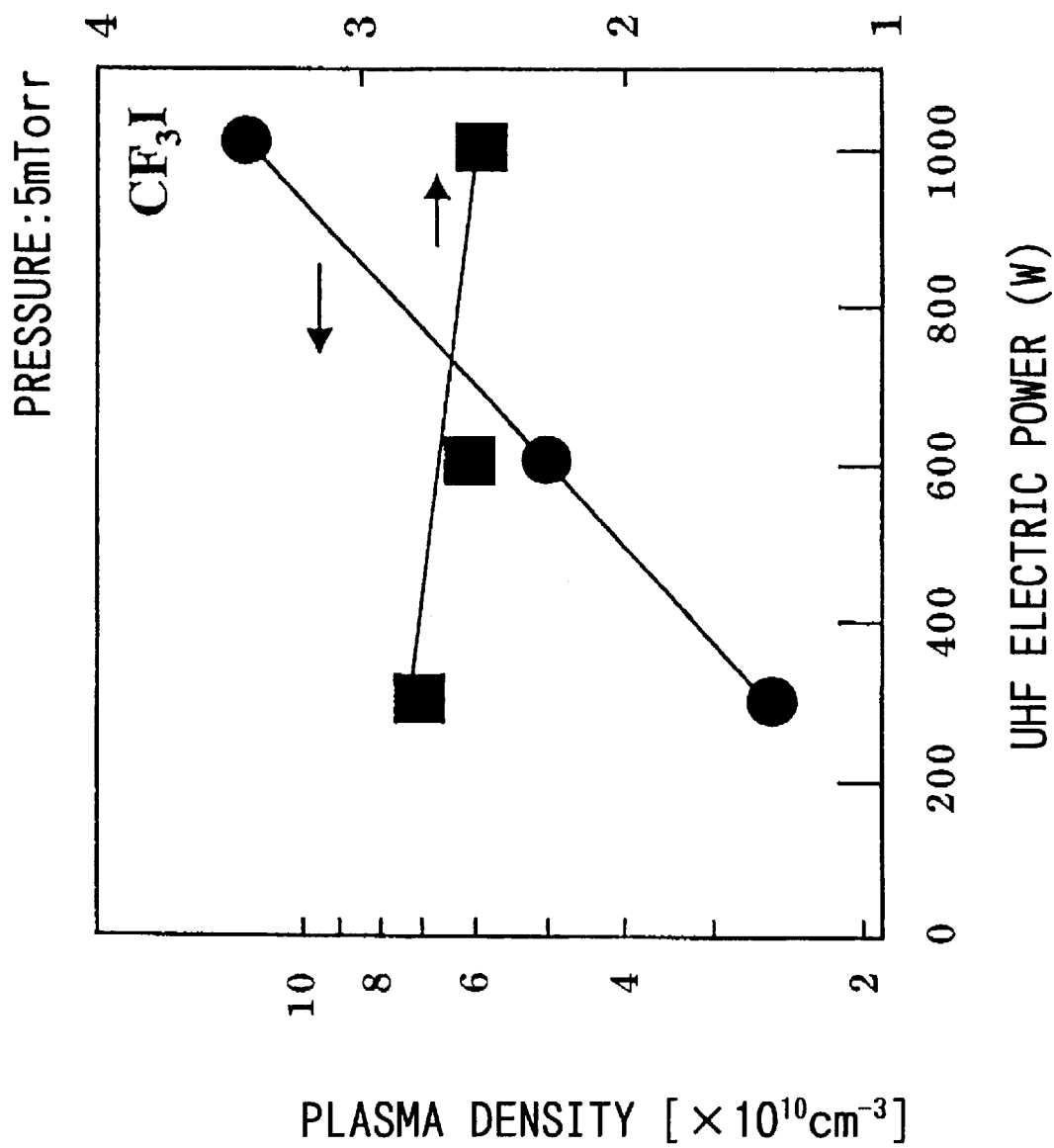
FIG. 7 is a graphic view showing plasma density and electron temperature versus UHF electric power in case of exciting $CF_3I$ gas with UHF plasma according to a process of the present invention.
Figure 8:
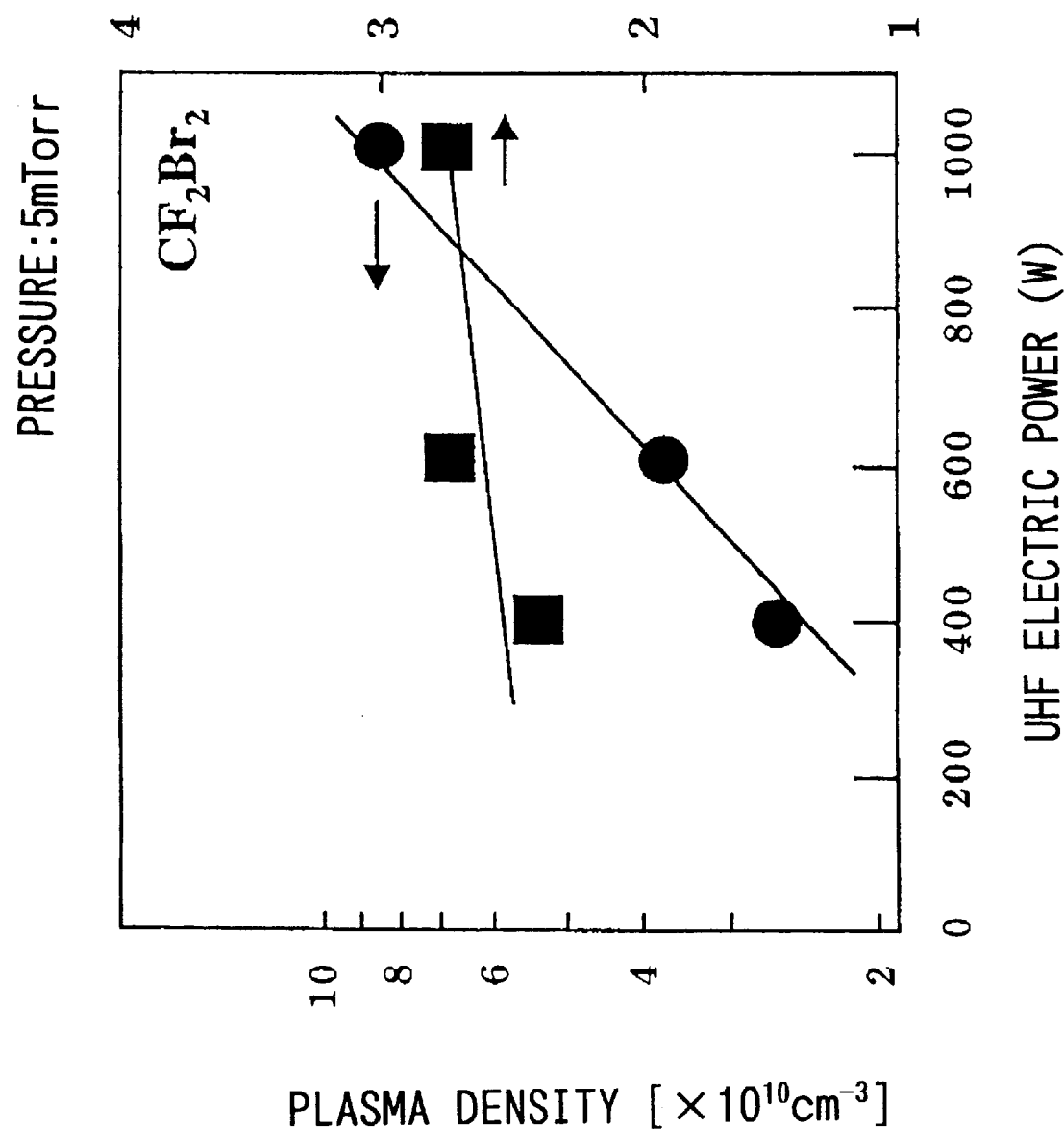
FIG. 8 is a graphic view showing plasma density and electron temperature versus UHF electric power in case of exciting $CF_2Br_2$ gas with UHF plasma according to a method of the present invention.

FIGS. 6 to 8 are graphs each showing the change of plasma density and electron temperature vs. UHF electric power in case of using $CF_4$, $CF_3I$ or $CF_2Br_2$. In all the cases, the plasma density tends to increase as the UHF electric power is increased. As compared with the case using treating gases applied in this invention ($CF_3I$ and $CF_2Br_2$), the increase of the plasma density tends to become saturated as the UHF electric power increases in case of using a conventional treating gas ($CF_4$). Further, the electron temperature can be lowered by using treating gases applied in this invention as compared with the case using the conventional treating gas.

Reasons which make the above difference of the plasma properties can be considered as follows.

Excitation of $CF_4$, which is one of conventional treating gases, in plasma causes at first a dissociation reaction of C—F bond likely to $CF_4 CF_3 + F \rightarrow$ ... to produce a radical. The radical is further ionized. Electrons are emitted during this time, and plasma is maintained thereby. The F radical produced in the above reaction has a large ionization potential of 17.4 eV so that it is difficult to be ionized. In addition, the above reaction is also difficult to be caused on account that the C—F bond is very strong. Consequently, the density of produced radical will become low. As a result, the plasma density is difficult to be increased in spite of increasing the UHF electric power in case of using $CF_4$ as a treating gas. Further, plasma is maintained under such conditions so that the ratio of high energy electrons distributed in plasma becomes relatively increased. Consequently, the electron temperature becomes high.

In contrast to this, when excitation is carried out with UHF plasma by using CF I, a dissociation reaction of $CF_3I$ $CF_3+I$ is advanced predominantly. This reaction is advanced in a very high efficiency owing to the weakness of the C—I bond. The I radical produced thereby has a small ionization potential of 10.4 eV so that it can be easily ionized to become $I^+$ and emit an electron. As a result, high plasma density can be easily obtained as compared with the case using $CF_4$ gas and the electron temperature can be maintained low on account that the maintenance of plasma is easy.

FIG. 8 is an explanatory view of another exemplary method of the present invention in which $CF_2Br_2$ is used as for a treating gas. It is evident from the comparison of FIG. 8 with FIG. 6 which is an explanatory view of the conventional method, that the tendency of plasma properties is quite similar with those in case of using $CF_3I$. Here, the ionization potential of Br is 11.8 eV which is higher than that of I but very lower than that of F. Accordingly, Br radical is easily ionized as compared with F radical.

It can be seen from the above that the process of the present invention not only has an essential effect of producing desired radical and/or ion selectively but also makes it possible to provide a high plasma density easily. Further, another effect of providing plasma of low electron temperature can be obtained. These are very effective to increasing a treating speed, lowering the damage of a substrate to be treated and the like especially in case of applying to actual etching or thin film deposition.

Figure 9:
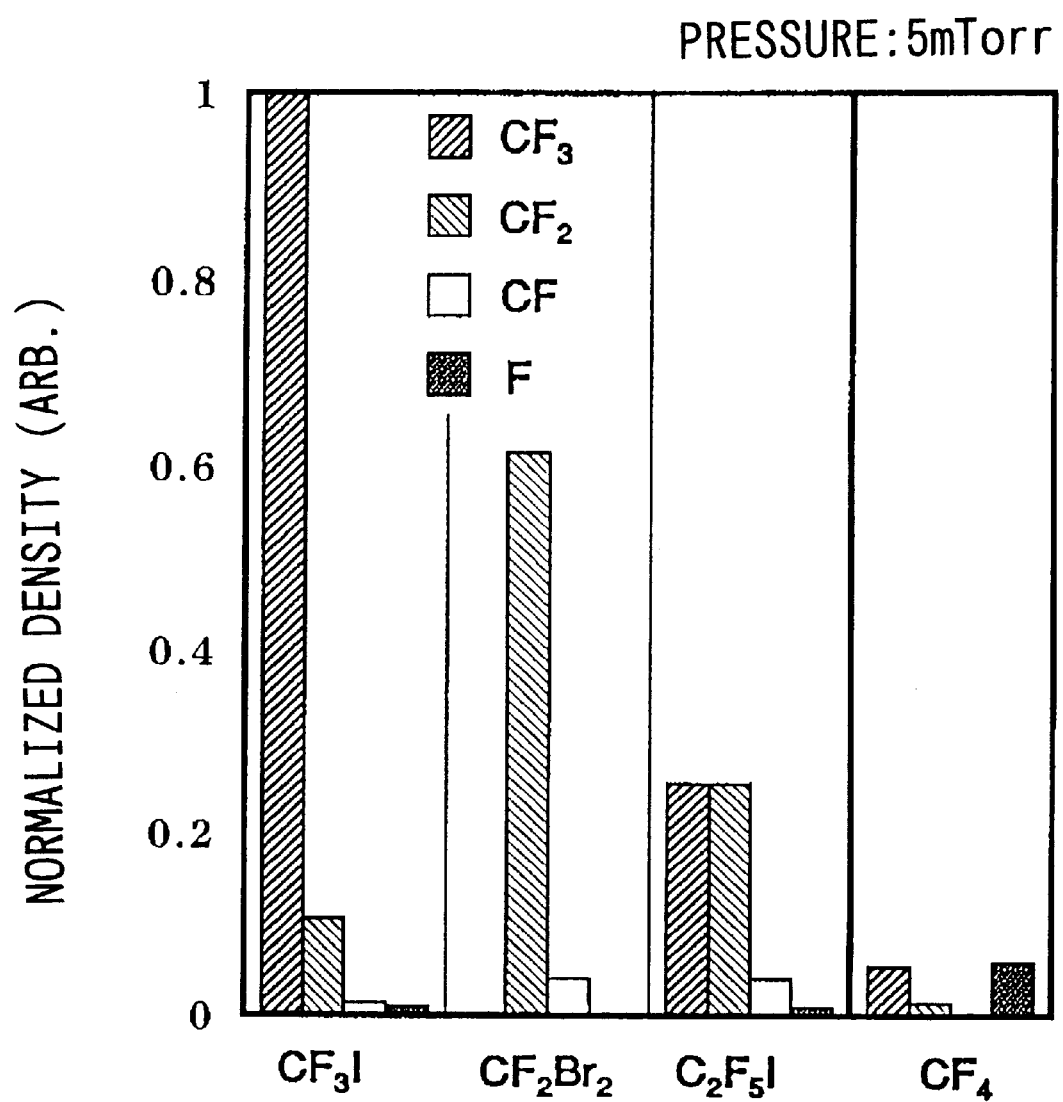
FIG. 9 is a view showing each amount of radicals produced by exiting various treating gases with UHF plasma.

FIG. 9 shows kinds of radicals produced by excitation with UHF plasma using various treating gases. This figure shows each density of $CF_3$, $CF_2$, CF and F species produced by exciting each parent gas of $CF_3I$, $CF_2Br_2$ and $C_2F_5I$, as a gas which contains two or more kinds of halogen elements and is applied in this invention, and $CF_4$ which is taken up as a representative example of fluoro carbon gas applied in the prior art as for a treating gas.

As is evident from FIG. 9, it can be ascertained that aimed radical is selectively produced depending on the kind of treating gas to be used according to the present invention. In other words, $CF_3$ radical is selectively produced when $CF_3I$ is used as a treating gas, $CF_2$ radical is selectively produced when $CF_2Br_2$ is used in place of $CF_3I$, and $CF_3$ and $CF_2$ radicals in a ratio of 1:1 are selectively produced when $C_2F_5I$ is used in place of $CF_3I$. These cases can be distinguished from the case of dissociating $CF_4$ gas in that the density of resulting radicals is very high and that almost no F radical is produced in the course of dissociating a treating gas.

There can be observed occurrence of $CF_2$ radical other than the aimed $CF_3$ radical. However, there can be observed almost no F radical which is to be produced naturally at the same time when dissociation of $CF_3$ is further advanced to produce $CF_2$ radical. The used treating gas of $CF_3I$ is low in purity and contains molecules such as $CF_2I_2$ and the like which are different from $CF_3I$ in the ratio of fluorine element to iodine element. Taking these matters into consideration, it is highly possible that the observed $CF_2$ radical was produced by the dissociation of $CF_2I_2$ which had been contained as an impurity in the parent gas. In other words, it can be expected that apparent selectivity can be improved by using a highly purified treating gas.

Under the aforementioned conditions, etching of $SiO_2$ deposited on a Si substrate ($SiO_2$/Si etching) was carried out. As a treating gas, a gas mixture of $CF_3I$, $CF_2I_2$ and $CFI_3$ in a ratio of $CF_3I$:$CF_2I_2$:$CFI_3$=5:2:3 was used. The inner pressure of the vacuum chamber was kept $5 \times 10^{-3}$ Torr at the time of introducing the gas. The UHF plasma was produced by application of a high frequency of 500 MHz. The substrate to be treated was the same with that of Example 1.

As a result of this experiment, there was obtained about 100 of a etching selection ratio of $SiO_2$/Si which is much higher than the conventional value. Further, the microloading was not observed even on the spot of a contact hole of 0.1 μm in diameter having a high aspect ratio. Active species produced in the vacuum chamber in the course of etching were determined by emission spectroscopic analysis and mass spectrometric analysis. As a result, the active species were a mixture of $CF_3$, $CF_2$ and CF in the ratio of $CF_3$:$CF_2$:$CF$=5:2:3. This ratio almost corresponds to that of the treating gas composition.

In this example, a sufficiently practicable etching speed of not less than 1 g m/min was obtained. This is owing to the UHF plasma capable of producing a very high density of plasma. From this viewpoint, the process applied in this example is advantageous over the process of Example 1 in which active species are produced by the irradiation of an electron beam or light.

In the first embodiment of the present invention as explained above, as a treating gas, a gas mixture of $CF_3I$, $CF_2I_2$ and $CFI_3$ in the ratio of $CF_3I$:$CF_2I_2$:$CFI_3$=5:2:3 was used. However, this mixing ratio may be changed appropriately at any ratio. For example, increasing the ratio of $CF_3I$ is effective to the increase of $CF_3^+$ ion for increasing the etching speed. Increasing the ratio of $CFI_3$ is effective to the increase of CF radical for inhibiting the microloading. Of course, optimum mixing ratio of these gas ingredients varies depending on the kind of substrate. These variation belongs to a matter of workshop modification, and accordingly, is within the purview of the present invention.

In the above embodiment of the present invention, as for a treating gas, a substituted $CF_4$ gas whose one or more of four fluorine elements is substituted by an iodine element was used. However, a $CF_mBr_n$ gas, that is, a substituted $CF_4$ gas whose one or more of four fluorine elements is substituted by an bromine element may be used in place of the above gas. In this case, an excitation energy of an excitation means for exciting a treating gas may be set so as to satisfy an energy range larger than the bond dissociation energy of C—Br bond (3.00 eV) and smaller than the bond dissociation energy of C—F bond (4.89 eV).

In Examples 1 and 2, no iodine element remained on the surface of the substrate after etching and no influence of iodine element contained in the used gas was observed.

Second Mode of the Embodiment

As a second mode of the present invention, a depositing process of a fluorinated amorphous carbon by the application of a CVD process, to which a process of the present invention for producing active species is applied will be explained.

An a-C:F has been tried to be used for an interlaminar insulating film mainly in a multi-layerd wiring structure because of its possible range of dielectric constant (approximately 2 to 3) lower than that of $SiO_2$ (e r about 4) which has been widely used as insulating materials of a semiconductor device. The dielectric constant of the a-C:F depends on the fluorine content (concentration) in its film and is lowered by increasing a fluorine content of the film. When this fluorine content is too much, there will be caused problems of lowering the heat resistance of the a-C:F itself, removal of fluorine in the course of heating, corrosion of a surrounding structure and the like. Accordingly, in order to make use of the low dielectric properties of the a-C:F film, intended control at desire of the fluorine content in the film depending on the application is desired now.

For controlling the fluorine content, control of the kinds of active species ($CF_3$, $CF_2$, CF and etc.), which act as a precursor in depositing the a-C:F film, and their amount is effective. The fluorine content in the film will be increased when the film is formed by depositing, for example, $CF_3$ radical mainly, and will be decreased when the film is formed by depositing CF radical. Accordingly, in accordance with the process of the present invention, the fluorine content in the a-C:F film can be expectedly controlled by using a gas mixture of, for example, $CF_3I$, $CF_2I_2$, $CFI_3$ and the like as a treating gas (raw material) and changing their mixing ratio.

In order to apply the a-C:F film as an interlaminar insulating film, it is important to form the film so as to be well embedded between wiring structures. For realizing this state, control of active species according to the process of the present invention is very effective. Explaining more in detail, in order to improve the embedded properties of the film, it is preferable to use an active species of a small adsorptivity to a substrate such as CF rather than that of a large adsorptivity such as $CF_3$ or $CF_2$. For this purpose, it is better to use, for example, a $CFI_3$ gas as raw materials and to produce CF radical selectively therefrom.

In this case, any excitation means capable of providing an energy larger than the bond dissociation energy of C—I bond and smaller than the bond dissociation energy of C—F bond can be employed.

EXAMPLE 3

Example of depositing an a-C:F film on a substrate with a UHF plasma excitation means will be explained below. The UHF plasma excitation means used in this example is illustrated in FIG. 3. In this example, an RF electric power supply is not connected to the substrate holder. Namely, this example is different from Example 2 in this point of applying no RF bias voltage.

As a treating gas, a gas mixture of $CF_3I$, $CF_2I_2$ and $CFI_3$ in an appropriate ratio was used with a proviso that $CF_3I$ is not less than 50% in consideration of the embedded properties of the a-C:F film. The discharge frequency of UHF plasma was 500 MHz similarly to Example 2.

As a result of this experiment, the fluorine content in the a-C:F film was controlled expectedly in a range of about $10^{18}/cm^3$ to $10^{21}/cm^3$ depending on the mixing ratio of $CF_3I$, $CF_2I_2$ and $CFI_3$ in the gas mixture. The dielectric constant of the a-C:F film (varied) in a range of about 2.1 to 2.8 correspondingly. Further, there was no problem concerning the embedded properties of the film even after depositing the film into the interspace between wiring structures formed previously on a substrate.

This result indicates that producing active species selectively according to the process of the present invention is effective for depositing a desired thin film on a substrate. In the above example, a fluorocarbon gas was used for depositing an A-C:F film on a substrate. However, other halogen gas may be used for depositing other kind of thin film on a substrate in carrying out the present invention. For example, a thin film of titanium can be deposited on a substrate by using a halogenated titanium gas as for raw materials. A thin film of tungsten can be deposited on a substrate by using a halogenated tungsten gas as for raw materials. These applications are within the purview of the present invention.

Effects of the present invention are summarized below.

The present invention makes it possible to control expectedly kinds of active species, which act on a substrate, i.e., radical and/or ion, and their content in treating the substrate such as etching the substrate, depositing a thin film on the substrate and the like. Each kind of the process can be optimized and the freedom concerning the process can be distinguishably improved thereby.

Explaining more concretely, for example, in etching a substrate, high speed etching of high selection ratio with no microloading, which cannot be realized by the application of any process belonging to the prior art, can be realized by applying in a desirable ratio active species which advance etching and active species capable of polymerizing and inhibiting etching by the polymerized polymer, and accordingly, advancing the selection of etching according to the present invention.

In depositing a thin film on a substrate, quality and properties of the film such as halogen content in the film, embedded properties of the film and the like can be controlled with high accuracy according to the present invention.

It is obvious that the property, reliability, yield and the like of a semiconductor device can be improved by applying the etching and/or thin-film depositing process of the present invention.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A process for treating a substrate comprising the steps of: providing a gas containing in its molecule a first halogen element and a second halogen element having an elementic number larger than that of the first halogen element;
   removing the second halogen element selectively from said gas molecule by an excitation means to produce active species; and
   irradiating said active species to a substrate.

2. A process for treating a substrate comprising the steps of: providing plural kinds of gases each containing in its molecule a first halogen element and a second halogen element having an elementic number larger than that of the first halogen element;
   removing the second halogen element selectively from each molecule of said gases by an excitation means to produce active species; and
   irradiating said active species to a substrate.

3. The process as defined in claim 2, wherein said plural kinds of gases each have in their molecule the first halogen element and the second halogen element in a ratio different from each other.

4. The process as defined in claim 1, wherein the first halogen element is fluorine or chlorine, and the second halogen element is bromine or iodine.

5. The process as defined in claim 2, wherein the first halogen element is fluorine or chlorine, and the second halogen element is bromine or iodine.

6. The process as defined in claim 1, wherein the molecular of said gas or at least one of said gases is represented by the general formula: $C_lX_mY_n$ in which C is a carbon element, X is the first halogen element, Y is the second halogen element, 1, m, and n are positive integers, and m+n=21+2.

7. The process as defined in claim 2, wherein the molecular of said gas or at least one of said gases is represented by the general formula: $C_lX_mY_n$ in which C is a carbon element, X is the first halogen element, Y is the second halogen element, 1, m, and n are positive integers, and m+n=21+2.

8. The process as defined in claim 1, wherein said substrate is etched by irradiating said active species to said substrate.

9. The process as defined in claim 2, wherein said substrate is etched by irradiating said active species to said substrate.

10. The process as defined in claim 1, wherein a thin film is deposited on said substrate by irradiating said active species to said substrate.

11. The process as defined in claim 2, wherein a thin film is deposited on said substrate by irradiating said active species to said substrate.

12. A process for treating a substrate comprising the steps of:
   providing a gas containing in its molecule a first halogen element and a second halogen element having an elementic number larger than that of the first halogen element;
   removing the second halogen element selectively from said gas molecule by an excitation means to produce active species; and
   irradiating said active species to a substrate wherein said excitation means is capable of giving said molecule of said gas and energy which is larger than the bond disassociation energy at the second halogen element but smaller than the bond disassociation energy of the first halogen element.

13. A process for treating a substrate comprising the steps of:

providing plural kinds of gases each containing in its molecule a first halogen element and a second halogen element having an elementic number larger than that of the first halogen element;

removing the second halogen element selectively from each molecule of said gases by an excitation means to produce active species; and irradiating said active species to a substrate wherein said excitation means is capable of giving said molecule of said gas an energy which is larger than the bond disassociation energy of the second halogen element but smaller than the bond disassociation energy of the first halogen element.

14. The process as defined in claim 12, wherein said excitation means is capable of exciting said molecule of said gas by exposing to plasma, irradiation of charged particles or irradiation of an electromagnetic wave.

15. The process as defined in claim 13, wherein said excitation means is capable of exciting said molecule of said gas by exposing to plasma, irradiation of charged particles or irradiation of an electromagnetic wave.

16. The process as defined in claim 12, wherein said excitation means is a UHF plasma excitation means in which said UHF plasma is formed by applying of high frequency ranging from 100 MHz to 1,000 MHz.

17. The process as defined in claim 13, wherein said excitation means is a UHF plasma excitation means in which said UHF plasma is formed by applying of high frequency ranging from 100 MHz to 1,000 MHz.

* * * * *